United States Patent
Chambers et al.

(10) Patent No.: US 7,601,577 B2
(45) Date of Patent: Oct. 13, 2009

(54) WORK FUNCTION CONTROL OF METALS

(75) Inventors: James Joseph Chambers, Dallas, TX (US); Mark Robert Visokay, Richardson, TX (US); Luigi Colombo, Dallas, TX (US); Antonio Luis Pacheco Rotondaro, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/870,631

(22) Filed: Oct. 11, 2007

(65) Prior Publication Data

US 2008/0044957 A1 Feb. 21, 2008

Related U.S. Application Data

(62) Division of application No. 11/220,451, filed on Sep. 7, 2005, now Pat. No. 7,291,527.

(51) Int. Cl.
*H01L 21/336* (2006.01)
*H01L 21/8234* (2006.01)
*H01L 21/8238* (2006.01)
*H01L 21/4763* (2006.01)
*H01L 21/3205* (2006.01)

(52) U.S. Cl. ............... 438/197; 438/100; 438/275; 438/585; 438/591; 438/592; 438/622; 438/653; 438/761; 257/E21.177; 257/E21.202; 257/E21.637

(58) Field of Classification Search .......... 257/E21.202, 257/E21.637, E21.177
See application file for complete search history.

(56) References Cited

U.S. PATENT DOCUMENTS

| | | |
|---|---|---|
| 6,204,103 B1 | 3/2001 | Bai et al. |
| 6,265,258 B1 | 7/2001 | Liang et al. |
| 6,770,521 B2 | 8/2004 | Visokay et al. |
| 2003/0180994 A1* | 9/2003 | Polishchuk et al. .......... 438/199 |
| 2004/0238859 A1* | 12/2004 | Polishchuk et al. .......... 257/274 |
| 2006/0084217 A1* | 4/2006 | Luo et al. .................... 438/199 |
| 2006/0134848 A1 | 6/2006 | Lander et al. |
| 2006/0134870 A1* | 6/2006 | Luan et al. ................... 438/287 |
| 2007/0037333 A1 | 2/2007 | Colombo et al. |
| 2007/0037335 A1 | 2/2007 | Chambers et al. |

* cited by examiner

*Primary Examiner*—Savitri Mulpuri
*Assistant Examiner*—Mohsen Ahmadi
(74) *Attorney, Agent, or Firm*—Jacqueline J. Garner; Wade J. Brady, III; Frederick J. Telecky, Jr.

(57) ABSTRACT

Forming metal gate transistors that have different work functions is disclosed. In one example, a first metal, which is a 'mid gap' metal, is manipulated in first and second regions by second and third metals, respectively, to move the work function of the first metal in opposite directions in the different regions. The resulting work functions in the different regions correspond to that of different types of the transistors that are to be formed.

10 Claims, 11 Drawing Sheets

WORK FUNCTION CONTROL OF METALS

This is a divisional application of Ser. No. 11/220,451 filed Sep. 7, 2005.

FIELD OF INVENTION

The present invention relates generally to semiconductor devices and more particularly to fabricating PMOS and NMOS transistor devices having metal gates.

BACKGROUND OF THE INVENTION

It can be appreciated that several trends presently exist in the electronics industry. Devices are continually getting smaller, faster and requiring less power, while simultaneously being able to support and perform a greater number of increasingly complex and sophisticated functions. One reason for these trends is an ever increasing demand for small, portable and multifunctional electronic devices. For example, cellular phones, personal computing devices, and personal sound systems are devices which are in great demand in the consumer market. These devices rely on one or more small batteries as a power source while providing increased computational speed and storage capacity to store and process data, such as digital audio, digital video, contact information, database data and the like.

Accordingly, there is a continuing trend in the semiconductor industry to manufacture integrated circuits (ICs) with higher device densities. To achieve such high densities, there has been and continues to be efforts toward scaling down dimensions (e.g., at submicron levels) on semiconductor wafers. To accomplish such high densities, smaller feature sizes, smaller separations between features and layers, and/or more precise feature shapes are required, such as metal interconnects or leads, for example. The scaling-down of integrated circuit dimensions can facilitate faster circuit performance and/or switching speeds, and can lead to higher effective yield in IC fabrication processes by providing or 'packing' more circuits on a semiconductor die and/or more die per semiconductor wafer, for example.

One way to increase packing densities is to decrease the thickness of transistor gate dielectrics to shrink the overall dimensions of transistors, where a very large number of transistors are commonly used in IC's and electronic devices. Transistor gate dielectrics (e.g., silicon dioxide or nitrided silicon dioxide) have previously had thicknesses on the order of about 10 nm or more, for example. More recently, however, this has been reduced considerably to reduce transistor sizes and facilitate improved performance. Thinning gate dielectrics can have certain drawbacks, however. For example, a polycrystalline silicon ("polysilicon") gate overlies the thin gate dielectric, and polysilicon naturally includes a depletion region where it interfaces with the gate dielectric. This depletion region can provide an insulative effect rather than conductive behavior, which is desired of the polysilicon gate since the gate is to act as an electrode for the transistor.

By way of example, if the depletion region acts like a 0.6 nm thick insulator and the gate dielectric is 10-nm thick, then the depletion region effectively increases the overall insulation between the gate and an underlying transistor channel by six percent (e.g., from 10 nm to 10.6 nm). It can be appreciated that as the thickness of gate dielectrics are reduced, the effect of the depletion region can have a greater impact on dielectric behavior. For example, if the thickness of the gate dielectric is reduced to 1 nm, the depletion region would effectively increase the gate insulator by about 60 percent (e.g., from 1 nm to 1.6 nm). This increased percentage significantly reduces the benefits otherwise provided by thinner gate dielectrics.

Metal gates can be used to mitigate adverse affects associated with the gate depletion region phenomenon because, unlike polysilicon, little to no depletion region manifests in metal. Interestingly enough, metal gates were commonly used prior to the more recent use of polysilicon gates. An inherent limitation of such metal gates, however, led to the use of polysilicon gates. In particular, the use of a single work function metal proved to be a limitation in high performance circuits that require dual work function electrodes for low power consumption. The work function is the energy required to move an electron from the Fermi level to the vacuum level. In modern CMOS circuits, for example, both p-channel MOS transistor devices ("PMOS") and n-channel MOS transistor devices ("NMOS") are generally required, where a PMOS transistor requires a work function on the order of 5 eV and an NMOS transistor requires a work function on the order of 4 eV. A single metal can not be used, however, to produce a metal gate that provides such different work functions. Polysilicon gates are suited for application in CMOS devices since some of the gates can be substitutionally doped in a first manner to achieve the desired work function for PMOS transistors and other gates can be substitutionally doped in a second manner to achieve the desired work for NMOS transistors.

Consequently, it would be desirable to be able to form metal gate transistors having different work functions so that transistor gate dielectrics can be reduced to shrink the overall size of transistors and thereby increase packing densities.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention relates to forming transistors having metal gates, where the metal gates have different work functions so as to correspond to that of different transistor types, such as NMOS and PMOS transistors, for example. The metal gates of the transistors allow device dimensions, such as gate dielectric thicknesses, for example, to be reduced to facilitate increased packing densities. Additionally, the transistors can be efficiently formed as part of a CMOS fabrication process.

According to one or more aspects of the present invention, a method of forming metal gate transistors is disclosed. The method includes forming a first metal over a dielectric layer overlying a substrate, where the first metal comprises a mid gap metal having a corresponding work function. A first region of the first metal is then manipulated to move the work function in a first direction, and a second region of the first metal is manipulated to move the work function in a second direction. A first transistor type is then formed in the first region, and a second transistor type is formed in the second region.

According to one or more other aspects of the present invention, a method of forming metal gate transistors is disclosed. The method includes forming a first metal over a dielectric layer overlying a substrate, the first metal having a first work function. The first metal is then manipulated in a first region to move the work function in a first direction. A first transistor type is subsequently formed in the first region, and a second transistor type is formed in a second region comprising the first metal.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

One or more aspects of the present invention are described with reference to the drawings, wherein like reference numerals are generally utilized to refer to like elements throughout, and wherein the various structures are not necessarily drawn to scale. It will be appreciated that where like acts, events, elements, layers, structures, etc., are reproduced, subsequent (redundant) discussions of the same may be omitted for the sake of brevity. In the following description, for purposes of explanation, numerous specific details are set forth in order to provide a thorough understanding of one or more aspects of the present invention. It may be evident, however, to one of ordinary skill in the art that one or more aspects of the present invention may be practiced with a lesser degree of these specific details. In other instances, known structures are shown in diagrammatic form in order to facilitate describing one or more aspects of the present invention.

Figure 1:
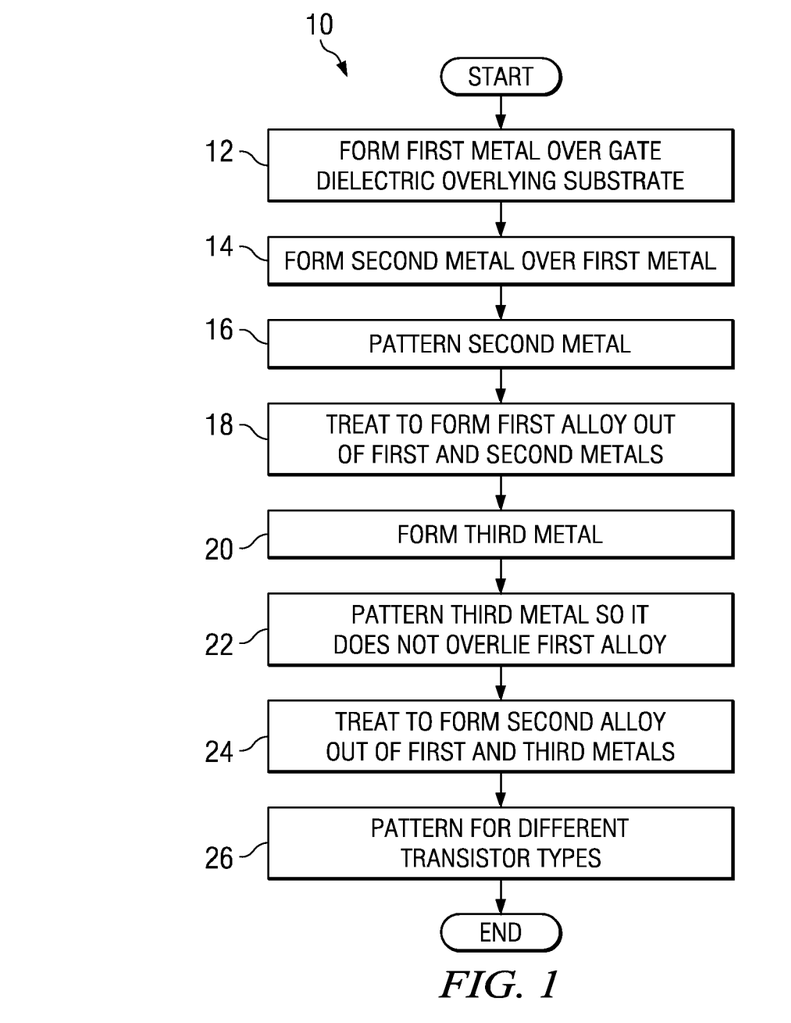
FIG. 1 is a flow diagram illustrating an exemplary methodology for forming metal gate transistors according to one or more aspects of the present invention.

Turning to FIG. 1, an exemplary methodology 10 is illustrated for forming metal gate transistors according to one or more aspects of the present invention. As with all methodologies discussed herein, although the methodology 10 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects of the present invention. Further, one or more of the acts may be carried out in one or more separate acts or phases. It will be appreciated that a methodology carried out according to one or more aspects of the present invention may be implemented in association with the formation and/or processing of structures illustrated and described herein as well as in association with other structures not illustrated or described herein.

Figure 2:
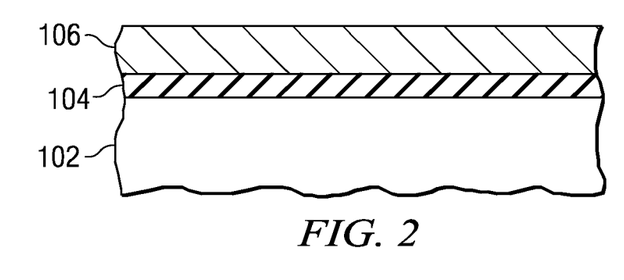
FIGS. 2-9 are fragmentary cross sectional diagrams illustrating the formation of exemplary metal gate transistors according to one or more aspects of the present invention, such as the methodology set forth in FIG. 1.

The methodology 10 begins at 12, wherein a semiconductor substrate 102 having a thin layer of dielectric material 104 has a first metal M1 106 formed thereover (FIG. 2). It will be appreciated that 'substrate' as referred to herein may comprise any type of semiconductor body (e.g., formed of silicon or SiGe) such as a semiconductor wafer or one or more die on a wafer, as well as any other type of semiconductor and/or epitaxial layers associated therewith. The dielectric material can have a thickness of less than about 150 Angstroms, for example, and may comprise a high k dielectric material, such as hafnium oxide, hafnium silicate, hafnium silicon oxynitride, zirconium oxide, zirconium silicate, zirconium silicon oxynitride, for example.

The first metal 106 generally has a work function between about 4 eV and about 5.2 eV, and more particularly between about 4.3 eV and about 4.8 eV. This is between the work functions of transistors that are to be fabricated upon the substrate 102. As such, the first metal 106 can be referred to as a mid gap metal, and may comprise Cr, Mo, W, TiN, and/or TaN for example. The first metal 106 can be formed in any suitable manner, such as via chemical vapor deposition (CVD), atomic layer deposition (ALD) and/or sputtering, for example, to a thickness of less than about 15 nanometers, for example.

Figure 3:
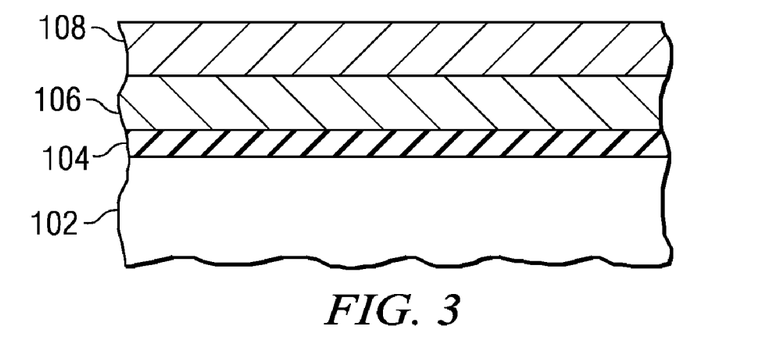

At 14, a second layer of metal M2 108 is formed over the first layer of metal 106 (FIG. 3). The second layer of metal 108 can be formed in any suitable manner, and is a used to modify or manipulate the first layer of metal 106 to achieve a work function for a particular type of transistor. To establish a work function for an NMOS type transistor, for example, the second layer of metal 108 may comprise Ti, V, Zr, Nb, Hf, Ta, for example, and have a work function of between about 3.0 eV and about 4.3 eV, for example.

Figure 4:
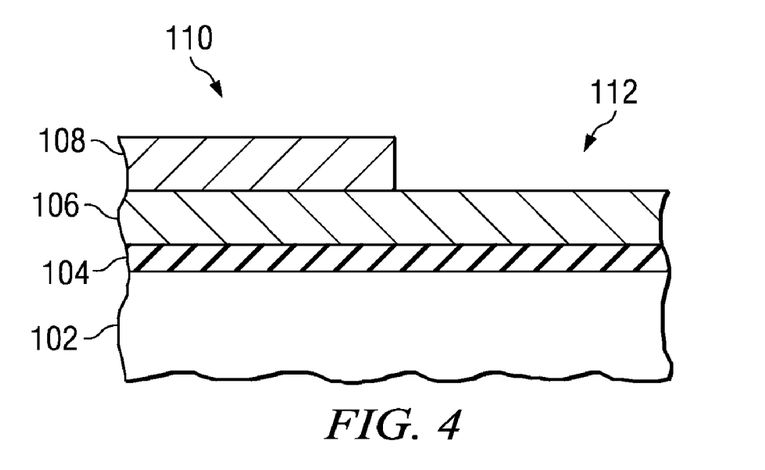

The second metal 108 is patterned at 16 so as to remain over the first metal 106 in a first region 110 and to expose the first metal 106 in a second region 112 (FIG. 4). It will be appreciated that (as with all patterning described herein) the patterning at 16 can be performed in any suitable manner, such as with lithographic techniques, for example, where lithography broadly refers to processes for transferring one or more patterns between various media. In lithography, a light sensitive resist coating (not shown) is formed over one or more layers to which a pattern is to be transferred. The resist coating is then patterned by exposing it to one or more types of radiation or light which (selectively) passes through an intervening lithography mask containing the pattern. The light causes the exposed or unexposed portions of the resist coating to become more or less soluble, depending on the type of resist used. A developer is then used to remove the more soluble areas leaving the patterned resists. The patterned resist can then serve as a mask for the underlying layer or layers which can be selectively treated (e.g., etched) to transfer the pattern thereto.

Although not illustrated, it will be appreciated that a patterned resist would be removed after it is used.

Figure 5:
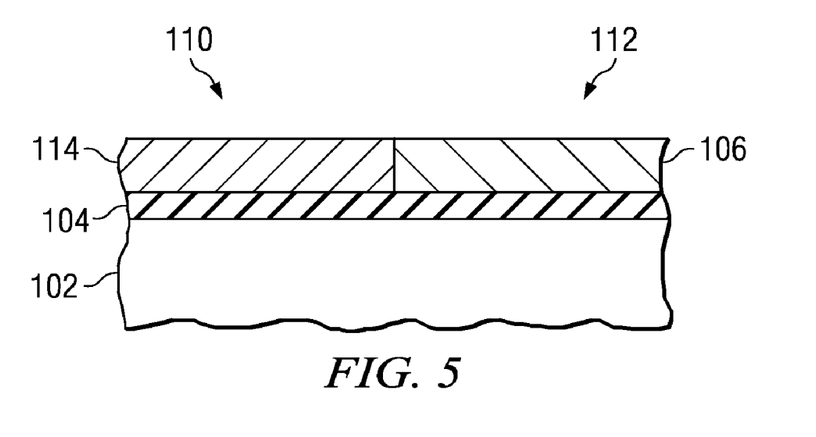

After the second metal 108 is patterned, an annealing or heating process is performed at 18 to create a first alloy M1M2 114 in the first region 110 out of the first 106 and second 108 metals (FIG. 5). As with all heating or annealing processed described herein, this process can be performed in an inert ambient at a temperature of between about 300 and about 1000 degrees Celsius for between about 10 seconds to about 5 minutes, for example. The resulting first alloy 114 may have a thickness of about 200 Angstroms or less, for example. For an NMOS type transistor, for example, the first alloy 114 can be fashioned to have a work function near about 4 eV, for example.

Figure 6:
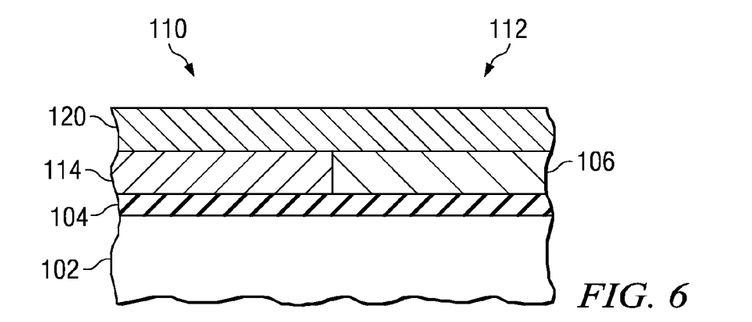

At 20, a third layer of metal M3 120 is formed over the first alloy 114 in the first region 110 and the first metal 106 in the second region 112 (FIG. 6). Like the second layer of metal 108, the third layer of metal 120 can be formed in any suitable manner, and is a used to modify or manipulate the first layer of metal 106 to achieve a work function for a particular type of transistor. To establish a work function for a PMOS type transistor, for example, the third layer of metal 120 may comprise Re, Ru, Os, Ni, Pd and/or Pt, for example, and have a work function of between about 4.8 eV and about 6.0 eV, for example.

Figure 7:
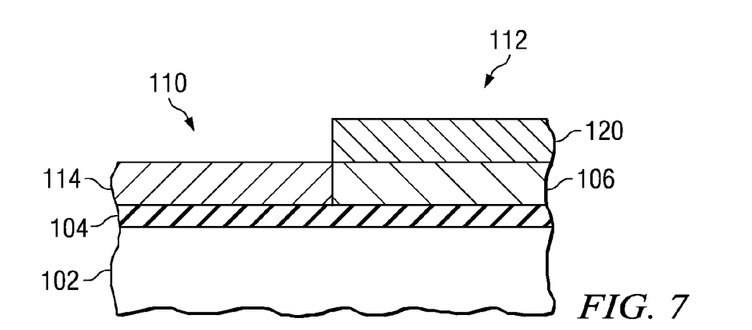
Figure 8:
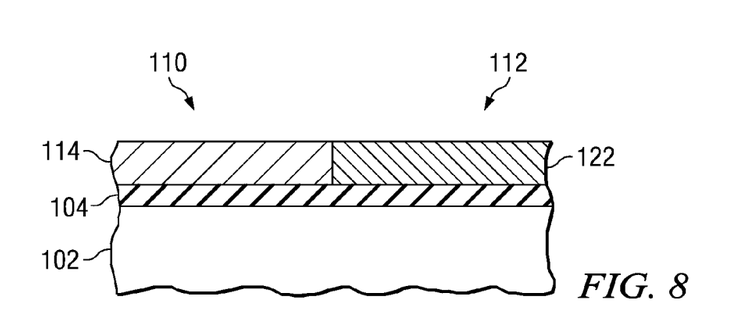

The third layer of metal 120 is then patterned at 22 so as to remain over the first metal 106 in the second region 112 and to expose the first alloy 114 in the first region 110 (FIG. 7). Another annealing or heating process is then performed at 24 to create a second alloy M1M3 122 in the second region 112 out of the first 106 and third 120 metals (FIG. 8). The annealing can be performed under the same or similar conditions as the annealing at 18. The resulting second alloy 122 may have a thickness of about 200 Angstroms or less, for example, and can be fashioned to have a work function near about 5 eV, for example, for a PMOS type transistor.

It will be appreciated that the respective thicknesses of the second 108 and third 120 metals can be varied to vary the resulting compositions of the first 114 and second 122 alloys. This effectively provides one means for controlling the respective work functions of the resulting alloys 114, 122. In one example, the second 108 and third 120 metals are formed to respective thickness of about 10 nanometers or less. Additionally, it will also be appreciated that the first 114 and second 122 alloys can be formed in a single annealing process. More particularly, the second 108 and third 120 metals can be formed and patterned over the first 110 and second 112 regions before any annealing is done. Then, once these layers 108, 120 are patterned, they can be subjected to a single annealing process to form the first 114 and second 122 alloys.

Figure 9:
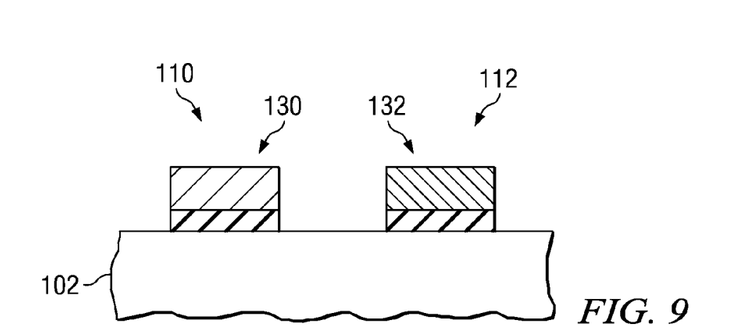

At 26, different transistor types are formed in the different regions 110, 112 (FIG. 9). For example, one or more NMOS type transistors can be fashioned in the first region 110 out of the first alloy M1M2 114, while one or more PMOS type transistors can be fashioned in the second region 112 out of the second alloy M1M3 122. Although not illustrated a layer of cladding or barrier material (e.g., a nitride based material) can optionally be formed over the first 114 and second 122 alloys. A layer of polysilicon can then optionally be formed over the layer of barrier material, where the barrier material mitigates unwanted interaction between the polysilicon and the first 114 and second 122 alloys. The polysilicon, barrier, first 114 and second 122 alloys and dielectric 104 materials can be patterned to form first and second gate structures 130, 132 in the first 110 and second 112 regions, respectively, where the gate structures have a height of between about 50 to about 150 nanometers, for example.

Although not illustrated, it will be appreciated that remaining aspects of the transistors can then be formed by doping the substrate 102 to establish source and drain regions therein adjacent to the gate structures, thereby establishing respective channel regions under the gate structures between the source and drain regions. LDD, MDD, or other extension implants can also be performed, for example, depending upon the type(s) of transistors to be formed, and left and right sidewall spacers can be formed along left and right lateral sidewalls of the respective gate structures. Silicide, metallization, and/or other back-end processing can also be subsequently performed.

Since a mid gap metal is used initially and is modified, forming different metal gate transistors as described herein is advantageous because a relatively small work function shift (e.g., on the order of about 400 milli volts) is needed. In addition to requiring larger work function shifts, starting with a higher work function metal or a lower work function metal is disadvantageous because lower work function metals tend to be very reactive with the dielectric materials 304, while higher work function metals tend to be very un-reactive which leads to poor adhesion to the dielectric materials 304. Manipulating a mid gap metal as described herein thus results in a reasonable level of adhesion, while not being overly reactive. Forming metal gate transistors as described herein can be readily implemented in a CMOS fabrication process in an efficient and cost effective manner.

Figure 10:
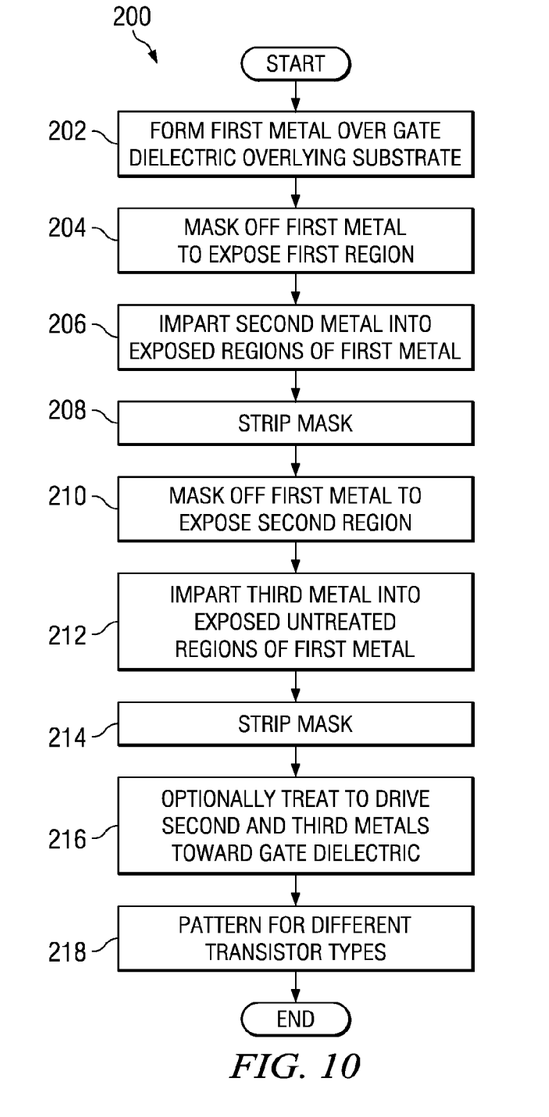
FIG. 10 is a flow diagram illustrating another exemplary methodology for forming metal gate transistors according to one or more aspects of the present invention.
Figure 11:
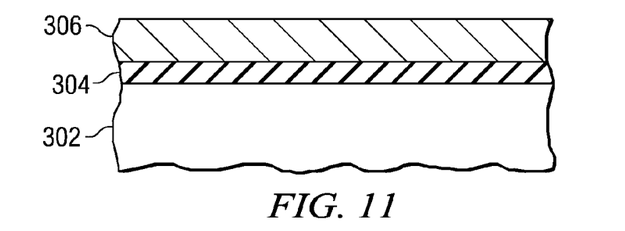
FIGS. 11-18 are fragmentary cross sectional diagrams illustrating the formation of exemplary metal gate transistors according to one or more aspects of the present invention, such as the methodology set forth in FIG. 10.

FIG. 10 illustrates another exemplary methodology 200 for forming metal gate transistors according to one or more aspects of the present invention. The methodology begins at 202 wherein a semiconductor substrate 302 having an overlying thin layer of dielectric material 304 has a first metal M1 306 formed thereover (FIG. 11). The dielectric material 304 may comprise a high k dielectric material and can have a thickness of less than about 150 Angstroms, for example. As before, the first metal 306 is a mid gap metal generally having a work function between about 4 eV and about 5 eV, and more particularly between about 4.3 eV and about 4.8 eV. The first metal 306 can comprise Cr, Cu, Zn, Mo, Ru, Sn, Sb, W, metal silicides and/or metal nitrides (e.g., TiN, TaN, WN, etc.), for example. The first metal 306 can be formed in any suitable manner, such as via chemical vapor deposition (CVD), atomic layer deposition (ALD) and/or sputtering, for example, to a thickness of less than about 35 nanometers, for example.

Figure 12:
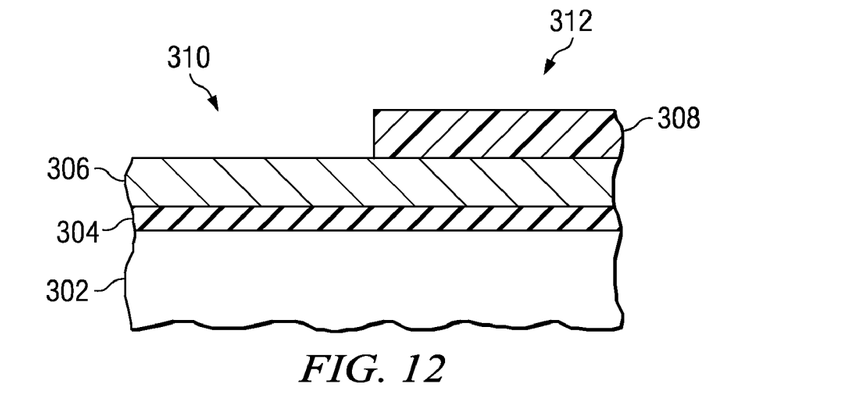
Figure 13:
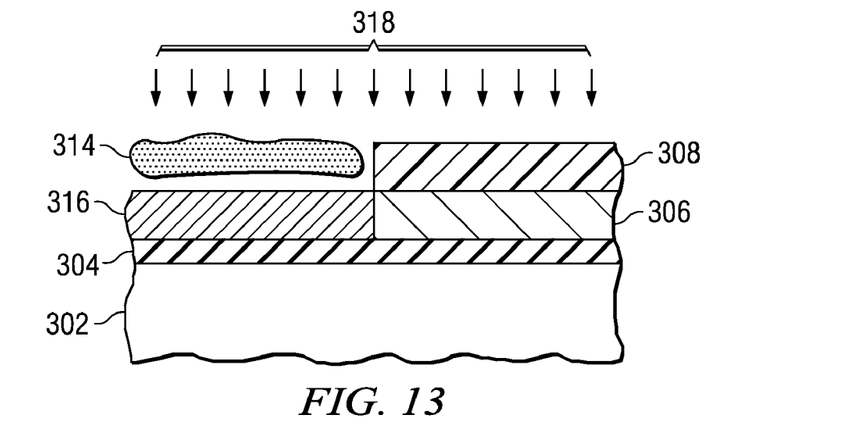

At 204, the first layer of metal M1 306 is masked off, such as with a selectively patterned masking material (e.g., a resist) 308 so as to leave the first metal 306 exposed in a first region 310 while covering the first metal 306 in a second region 312 (FIG. 12). At 206, a second metal M2 314 is selectively applied to the exposed portions of the first metal 306 in the first region 310 to form a first conglomerate M1M2 316 out of the first 306 and second 314 metals (FIG. 13). The second metal 314 can be added to the first metal 306 in any suitable manner, such as by a standard implementation process, a plasma implantation process and/or a deposition process 318, etc., for example.

It will be appreciated that the second metal 314 has a work function different from the work function of the first metal 306 so that a first work function of the first conglomerate M1M2 316 in the first region 310 is higher or lower than the work function of the first metal 306, but generally corresponds to the work function for a first type of transistor. To establish a work function near about 4 eV for an NMOS type transistor, for example, the second metal 314 may have a work function of between about 3.0 eV to about 4.3 eV, for example, and may comprise Sc, Ti, V, Fe, Nb, Cd, Sn, Hf, Ta, lanthanides, and/or actinides, for example.

Figure 14:
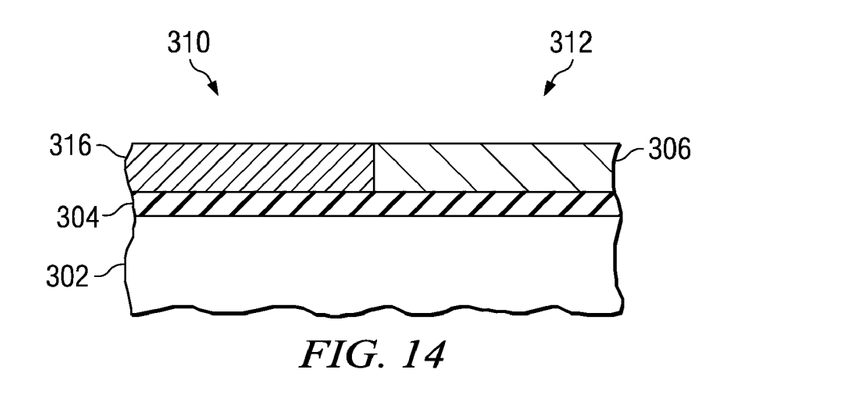
Figure 15:
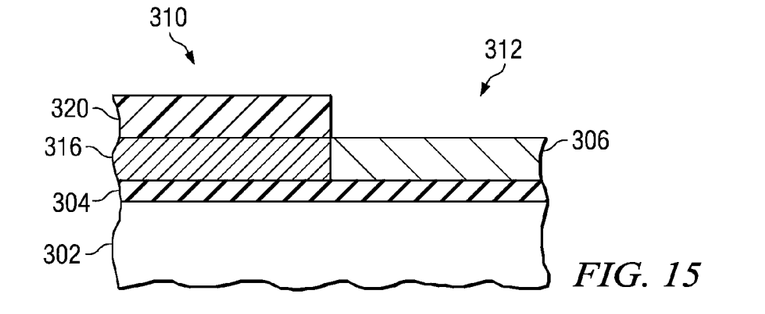
Figure 16:
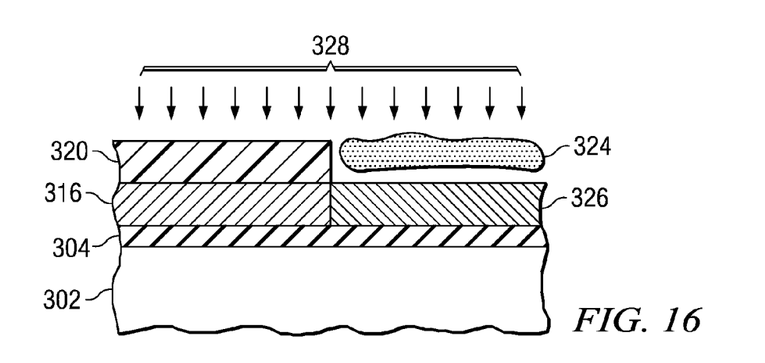

The patterned masking material 308 is then removed at 208 (FIG. 14), and at 210 the first metal 306 is again selectively masked off 320, but this time to leave the first metal 306 exposed in the second region 312 while covering the first conglomerate 316 in the first region 310 (FIG. 15). At 212, a third metal M3 324 is then selectively applied to the exposed portions of the first metal 306 in the second region 312 to form a second conglomerate M1M3 326 out of the first 306 and third 324 metals (FIG. 16). Again, the third metal 324 can be added to the first metal 306 in any suitable manner, such as by a standard implantation process, a plasma implantation process and/or a deposition process 328, etc., for example.

Additionally, the third metal 324 has a work function different from the work function of the first metal 306 so that a second work function of the second conglomerate M1M2 326 in the second region 312 is higher or lower than the work function of the first metal 306, but generally corresponds to the work function for a second type of transistor. To establish a work function near about 5 eV for a PMOS type transistor, for example, the third metal 324 may have a work function of between about 4.8 eV to about 6.0 eV, for example, and may comprise Be, Co, Ni, Se, Rh, Pd, Te, Re, Ir, Pt and/or Au, for example.

Figure 17:
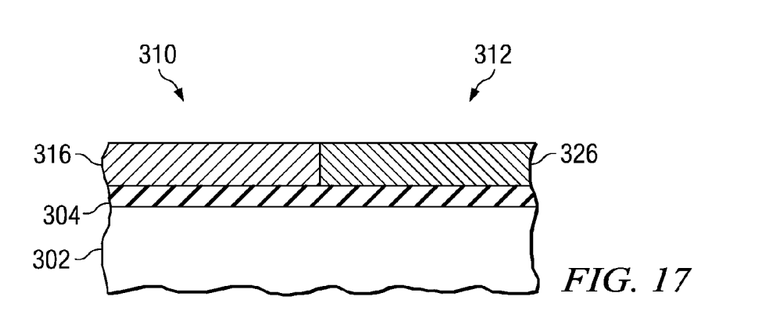
Figure 18:
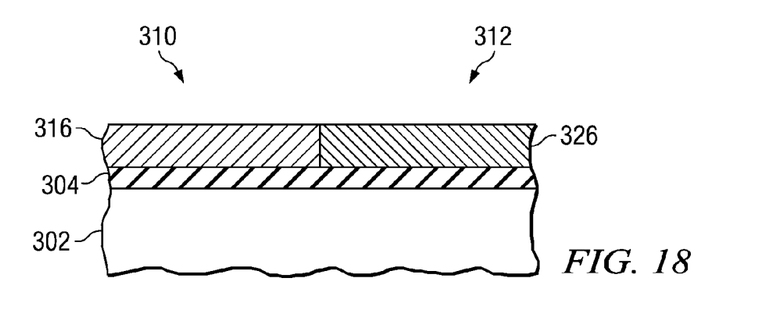

At 214, the patterned masking material 320 is removed (FIG. 17), and an optional anneal or heat treatment is performed at 216 to further instill the first and second work functions in the first 310 and second 312 regions, respectively. The annealing process thus drives the second 314 and third 324 metals toward the dielectric 304 such that the first 316 and second 326 conglomerates may have a graduated concentration of second 314 and third 324 metals, respectively, toward the dielectric 304 (FIG. 18).

It will be appreciated that the amount of second 314 and third 324 metals added to the first metal 306 in the first 310 and second 312 regions, respectively can be varied to vary the resulting compositions of the first 316 and second 326 conglomerates. This effectively provides one means for controlling the respective work functions in the first 310 and second 312 regions. Additionally, will also be appreciated that the first 316 and second 326 conglomerates can be annealed in separate annealing processes. More particularly, the first conglomerate 316 can be annealed before the third metal 324 is added to the first metal 306 to form the second conglomerate 326. The second conglomerate 326 can then subsequently be annealed.

Although not illustrated, different transistor types can be formed as described above in the different regions at 310, 312. For example, one or more NMOS type transistors can be fashioned in the first region 310 out of the first conglomerate M1M2 316, while one or more PMOS type transistors can be fashioned in the second region 312 out of the second conglomerate M1M3 326. A layer of cladding or barrier material (e.g., a nitride based material) can optionally be formed over the first 316 and second 326 conglomerates. A layer of polysilicon can then optionally be formed over the layer of barrier material, where the barrier material mitigates unwanted interaction between the polysilicon and the first 316 and second 326 conglomerates. The polysilicon, barrier, first 316 and second 326 conglomerates and dielectric 304 materials can be patterned to form first and second gate structures in the first 310 and second 312 regions, respectively, where the gate structures have a height of between about 50 to about 150 nanometers, for example.

Remaining aspects of the transistors can then be formed by doping the substrate 302 to establish source and drain regions therein adjacent to the gate structures, thereby establishing respective channel regions under the gate structures between the source and drain regions. LDD, MDD, or other extension implants can also be performed, for example, depending upon the type(s) of transistors to be formed, and left and right sidewall spacers can be formed along left and right lateral sidewalls of the respective gate structures. Silicide, metallization, and/or other back-end processing can also be subsequently performed. Forming metal gate transistors according to this method can be readily implemented in a CMOS fabrication process in an efficient and cost effective manner. By way of example, the annealing of the first 316 and second 326 conglomerates at 216 can be performed at any point in the fabrication process, such as concurrently with, or rather as part of, an annealing process that is utilized to 'activate' dopants in source and/or drain regions.

Figure 19:
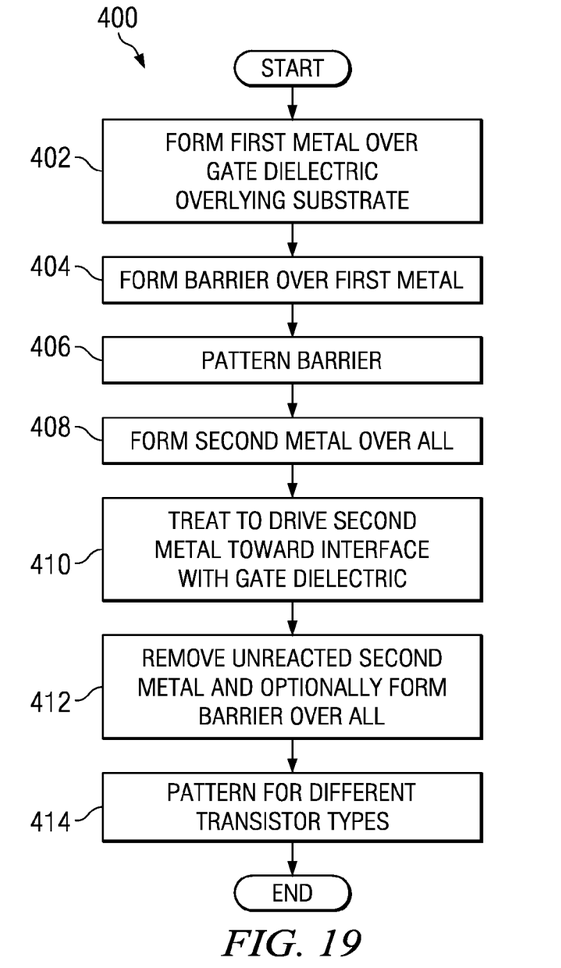
FIG. 19 is a flow diagram illustrating yet another exemplary methodology for forming metal gate transistors according to one or more aspects of the present invention.
Figure 20:
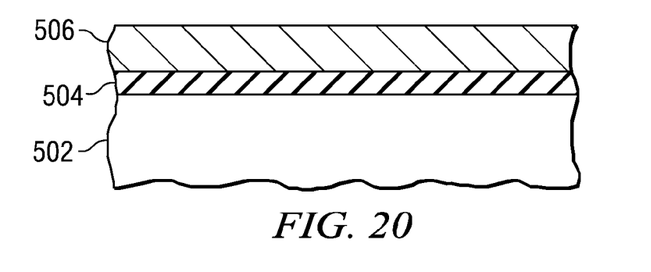
FIGS. 20-27 are fragmentary cross sectional diagrams illustrating the formation of exemplary metal gate transistors according to one or more aspects of the present invention, such as the methodology set forth in FIG. 19.

Turning to FIG. 19, yet another exemplary methodology 400 is illustrated for forming metal gate transistors according to one or more aspects of the present invention. The methodology begins at 402 wherein a semiconductor substrate 502 having an overlying thin layer of dielectric material 504 has a first metal M1 506 formed thereover (FIG. 20). The dielectric material 504 may comprise a high k dielectric material and can have a thickness of less than about 150 Angstroms, for example. In this example, the first metal 506 has a work function corresponding to the work function of a desired type of transistor. To form a PMOS device having a work function near about 5 eV, for example, the first metal 506 may comprise one or more higher work function metals, such as W, Mo and/or Ru, for example. The first metal 506 generally has a low solubility and is non reactive with regard to the dielectric 504.

Figure 21:
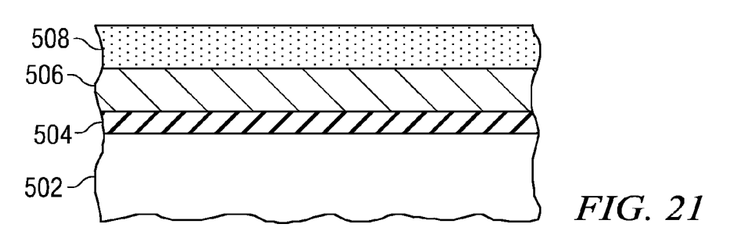
Figure 22:
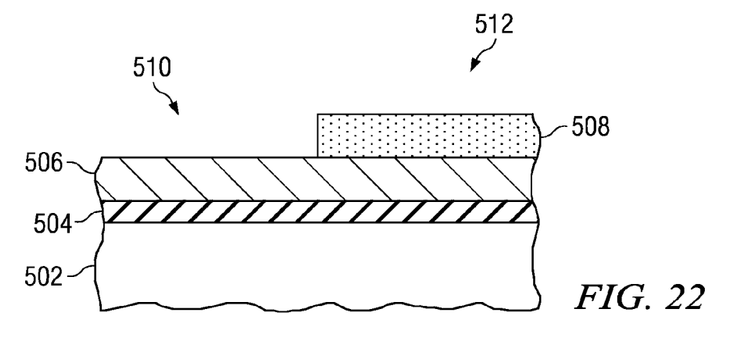

At 404, a layer of barrier material 508 is formed over the layer of first metal 506 (FIG. 21). The barrier material 508 is generally non reactive with the first metal 506 and can be formed thereover by a deposition process, for example. The barrier material 508 may comprise a nitride based material, such as $Si_3N_4$, for example. If this barrier is a dielectric, then it is stripped before the cladding layer is deposited. Alternatively, this barrier can be conductive and can remain. At 406, the layer of barrier material 508 is patterned so as to expose the first metal 506 in a first region 510 while remaining over the first metal 506 in a second region (FIG. 22). An optional (wet) clean (not shown) can be performed to remove residual aspects of the barrier material 508 from the first 506 in the first region 510.

Figure 23:
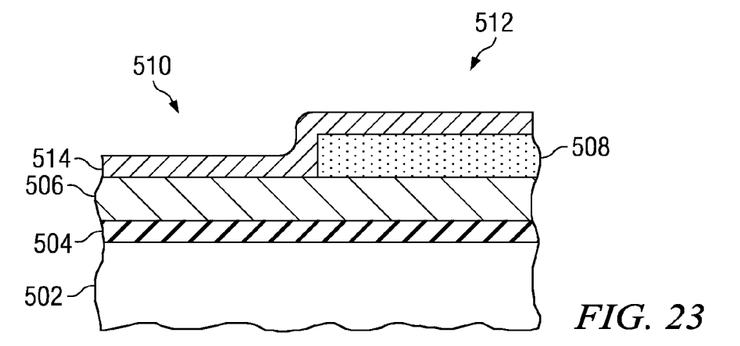

At 408, a thin coating of a second metal M2 514 is formed over the first metal 506 in the first region 510 and over the barrier layer 508 in the second region 512 (FIG. 23). The second metal generally has a lower work function, such as between about 3.5 eV and about 4.3 eV and may comprise La, Y, Hf, Zr. and/or Ti, for example. The second metal 514 is used to develop a desired work function in the first region 510 that corresponds to a second desired type of transistor. For an NMOS type transistor, for example, the second metal 514 is used to 'shift' the work function in the first region 510 down to about 4 eV, for example.

Figure 24:
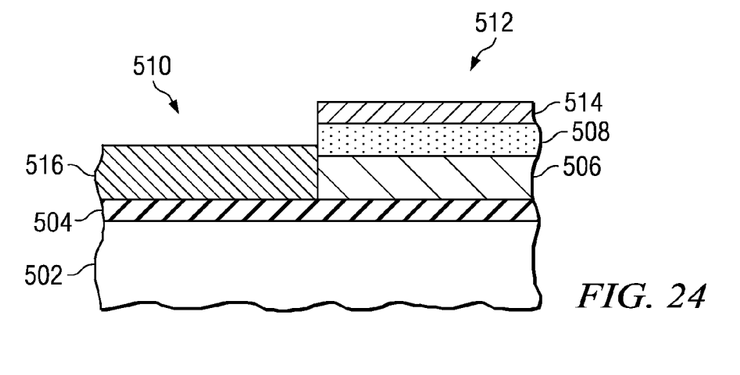

Accordingly, the second metal 514 is heated or annealed at 410 to cause it to diffuse into the first metal 506 toward the dielectric 504 (FIG. 24). In this manner a first conglomerate M1M2 516 having a first work function is formed in the first region 510.

Figure 25:
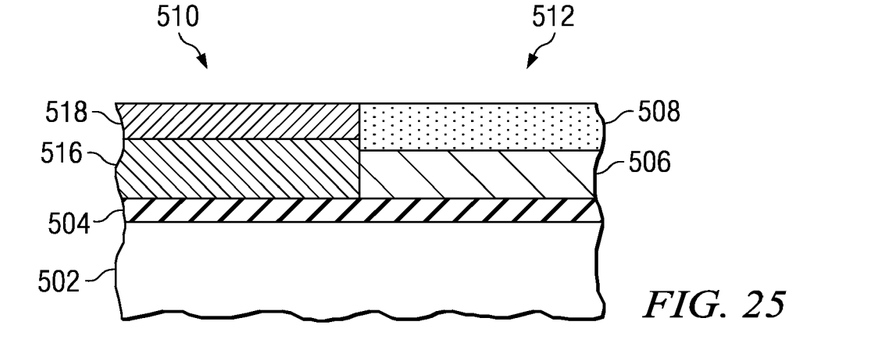

At 412, the remaining second metal 514 overlying the barrier material 508 in the second region 512 is removed and additional barrier material 518 (e.g., nitride based material) can optionally be formed over the conglomerate 516 in the first region 510 and over the barrier material 508 in the second region 512 (FIG. 25). It will be appreciated that the initial barrier material 508 can be removed before any additional barrier material 518 is applied if, for example, the initial barrier material 508 does not comprise a metal.

Figure 26:
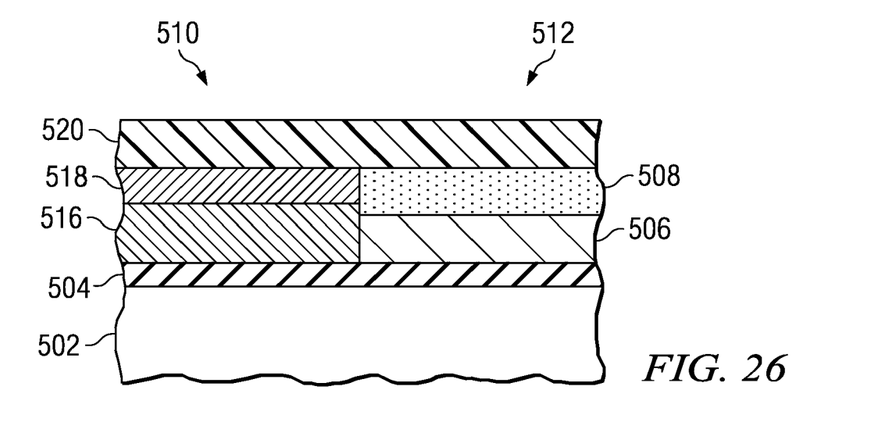
Figure 27:
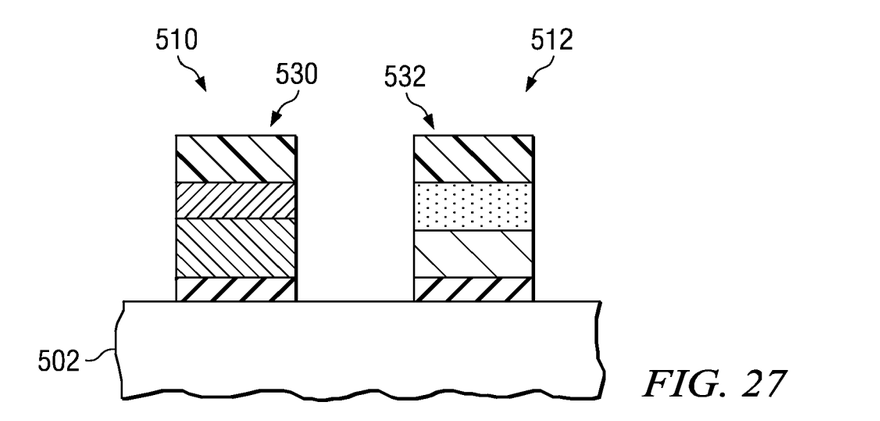

At 414, different transistor types are formed in the different regions 510, 512. For example, one or more NMOS type transistors can be fashioned in the first region 510 which has a first associated work function, while one or more PMOS type transistors can be fashioned in the second region 512 which has a second associated work function. It will be appreciated, however, that the materials used for the first and second metals can be reversed to reverse the work functions of the first and second metals. This would allow, for example, one or more PMOS type transistors to be fashioned in the first region 510, and one or more NMOS type transistors to be fashioned in the second region 512. A layer of polysilicon 520 can then optionally be formed over the barrier material 518 (FIG. 26). The polysilicon 520, barrier 518, first conglomerate 516, first metal 506 and dielectric 504 materials can be patterned to form first and second gate structures 530, 532 in the first 510 and second 512 regions, respectively, where the gate structures have a height of between about 50 to about 150 nanometers, for example (FIG. 27).

Although not illustrated, it will be appreciated that remaining aspects of the transistors can then be formed by doping the substrate 502 to establish source and drain regions therein adjacent to the gate structures, thereby establishing respective channel regions under the gate structures between the source and drain regions. LDD, MDD, or other extension implants can also be performed, for example, depending upon the type(s) of transistors to be formed, and left and right sidewall spacers can be formed along left and right lateral sidewalls of the respective gate structures. Silicide, metallization, and/or other back-end processing can also be subsequently performed. It will be appreciated that the thickness of first 506 and second 514 metals can be tuned to control the respective first and second work functions. For example, the second metal 514 can be between about 1.5 and about 3.5 nanometers thick to get the desired concentration of M2 penetrating into M1.

Figure 28:
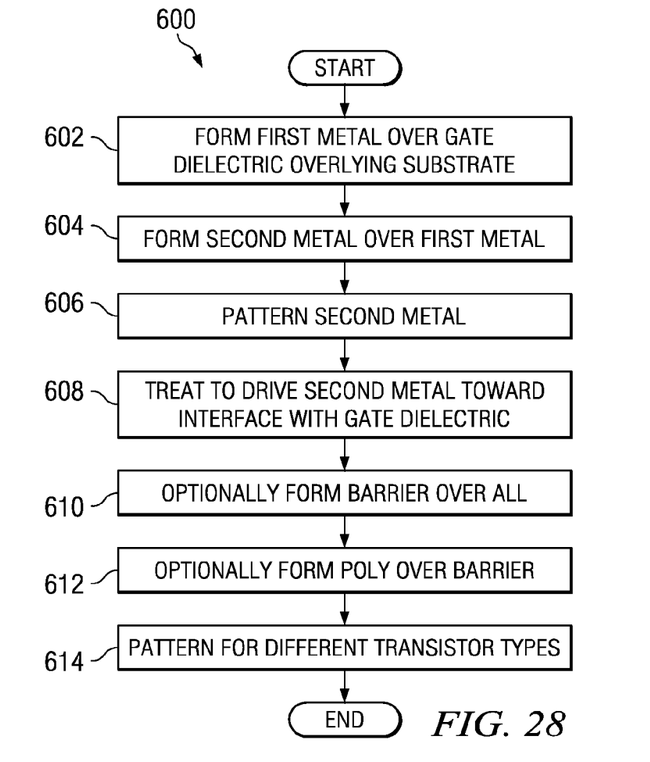
FIG. 28 is a flow diagram illustrating another exemplary methodology for forming metal gate transistors according to one or more aspects of the present invention.
Figure 29:
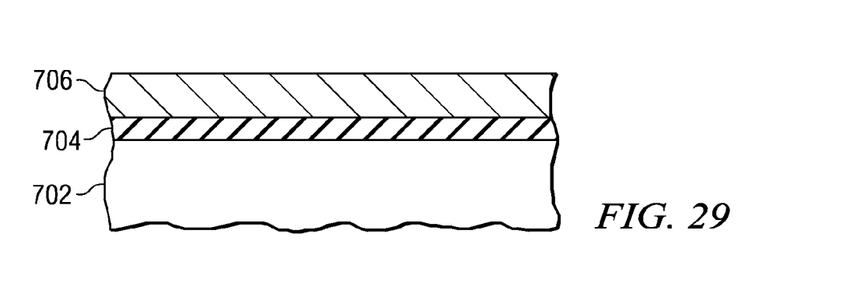
FIGS. 29-34 are fragmentary cross sectional diagrams illustrating the formation of exemplary metal gate transistors according to one or more aspects of the present invention, such as the methodology set forth in FIG. 28.

FIG. 28 illustrates another exemplary methodology 600 for forming metal gate transistors according to one or more aspects of the present invention. The methodology begins at 602 wherein a semiconductor substrate 702 having an overlying thin layer of dielectric material 704 has a first metal M1 706 formed (e.g., deposited) thereover (FIG. 29). The dielectric material 704 may comprise a high k dielectric material and can have a thickness of less than about 150 Angstroms, for example. In this example, the first metal 706 has a work function corresponding to the work function of a desired type of transistor. To form a PMOS device having work function near about 5 eV, for example, the first metal 706 may comprise one or more higher work function metals, such as W, Mo and/or Ru, for example. The first metal 706 generally has a low solubility and is non reactive with regard to the dielectric 704.

Figure 30:
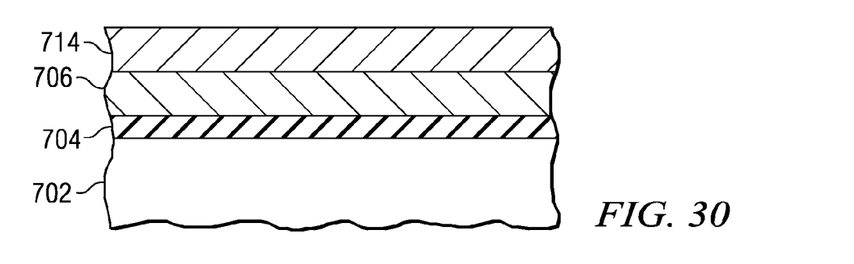
Figure 31:
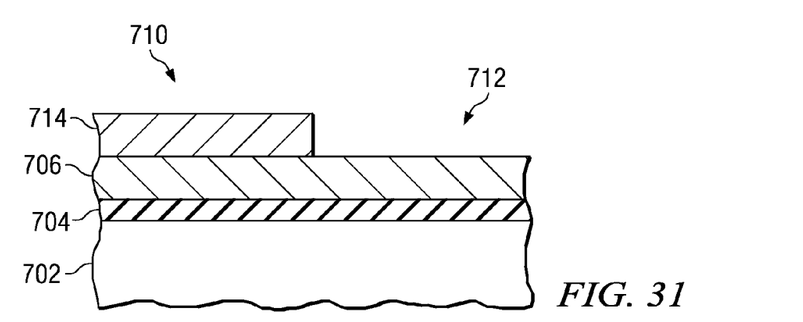

At 604, a second metal M2 714 is formed (e.g., deposited) over the first metal 706 (FIG. 30). At 606, the second metal 714 is selectively patterned so as to remain over the first metal 706 in a first region 710 while exposing the first metal 706 in a second region 712 (FIG. 31). The second metal generally has a lower work function, such as between about 3.5 eV and about 4.3 eV and may comprise La, Y, Hf, Zr, and/or Ti, for example. The second metal 714 is used to develop a desired work function in the first region 710 that corresponds to a second desired type of transistor. For an NMOS type transistor, for example, the second metal 714 is used to 'shift' the work function in the first region 710 down to around 4 eV, for example.

Figure 32:
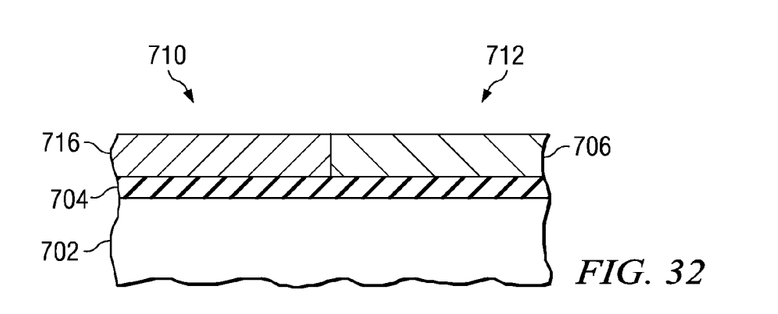

The second metal 714 is heated or annealed at 608 to cause it to diffuse into the first metal 706 toward the dielectric 704 (FIG. 32). In this manner a first conglomerate M1M2 716 having a first work function is formed in the first region 710.

Figure 33:
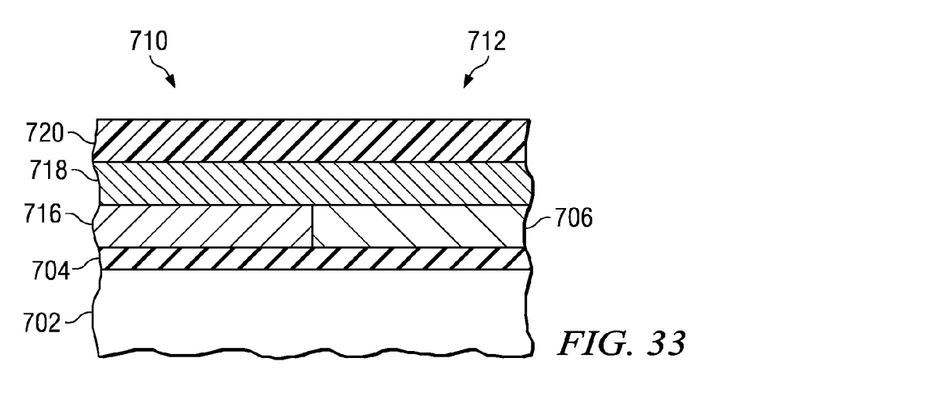
Figure 34:
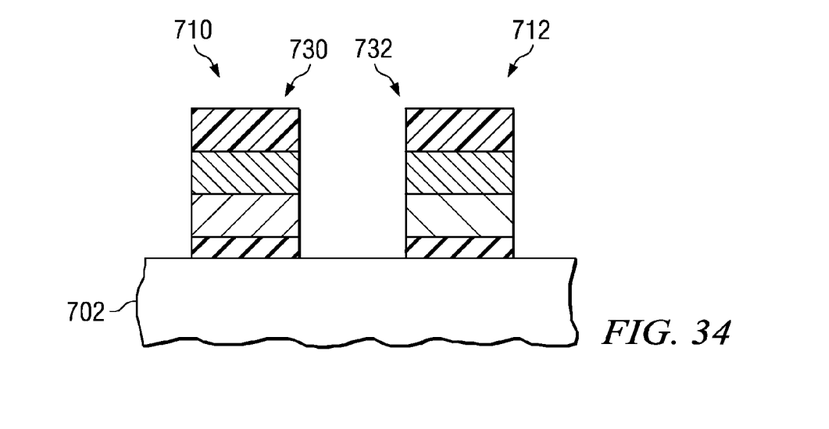

At 610, a cladding layer or barrier material 718 (e.g., nitride based material) is optionally formed over the first conglomerate 716 in the first region 710 and over the first metal 706 in the second region 712, and an optional layer of polysilicon 720 is formed over layer 718 at 612 (FIG. 33). At 614, different transistor types are formed in the different regions 710, 712. For example, one or more NMOS type transistors can be fashioned in the first region 710 which has a first associated work function, while one or more PMOS type transistors can be fashioned in the second region 712 which has a second associated work function. It will be appreciated, however, that the materials used for the first and second metals can be reversed to reverse the work functions of the first and second metals. This would allow, for example, one or more PMOS type transistors to be fashioned in the first region 710, and one or more NMOS type transistors to be fashioned in the second region 712. The polysilicon 720, barrier 718, first conglomerate 716, first metal 706 and dielectric 704 materials can be patterned to form first and second gate structures 730, 732 in the first 710 and second 712 regions, respectively, where the gate structures have a height of between about 70 to about 150 nanometers, for example (FIG. 34).

Although not illustrated, it will be appreciated that remaining aspects of the transistors can then be formed by doping the substrate 702 to establish source and drain regions therein adjacent to the gate structures, thereby establishing respective channel regions under the gate structures between the source and drain regions. LDD, MDD, or other extension implants can also be performed, for example, depending upon the type(s) of transistors to be formed, and left and right sidewall spacers can be formed along left and right lateral sidewalls of the respective gate structures. Silicide, metallization, and/or other back-end processing can also be subsequently performed. It will be appreciated that the thickness of first 706 and second 714 metals can be tuned to control the respective first and second work functions.

Accordingly, forming transistors according to one or more aspects of the present invention allow different types of metal gate transistors having different respective work functions to be concurrently formed in a single fabrication process. Forming the different types of transistors allows their respective advantages to be taken advantage of to satisfy different circuit application requirements. The metal gate transistors also allow feature sizes, such as dielectric thicknesses, for example, to be reduced to facilitate device scaling and increase packing densities.

It will be appreciated that while reference is made throughout this document to exemplary structures in discussing aspects of methodologies described herein (e.g., those structures presented in FIGS. 2-9 while discussing the methodology set forth in FIG. 1, structures presented in FIGS. 11-18 while discussing the methodology set forth in FIG. 10 structures presented in FIGS. 20-27 while discussing the methodology set forth in FIG. 19 and structures presented in FIGS. 29-34 while discussing the methodology set forth in FIG. 28), that those methodologies are not to be limited by the corresponding structures presented. Rather, the methodologies (and structures) are to be considered independent of one another and able to stand alone and be practiced without regard to any of the particular aspects depicted in the Figs.

It is also to be appreciated that layers and/or elements depicted herein are illustrated with particular dimensions relative to one another (e.g., layer to layer dimensions and/or orientations) for purposes of simplicity and ease of understanding, and that actual dimensions of the elements may differ substantially from that illustrated herein. Additionally, unless stated otherwise and/or specified to the contrary, any one or more of the layers set forth herein can be formed in any number of suitable ways, such as with spin-on techniques, sputtering techniques (e.g., magnetron and/or ion beam sputtering), (thermal) growth techniques and/or deposition techniques such as chemical vapor deposition (CVD), physical vapor deposition (PVD) and/or plasma enhanced chemical vapor deposition (PECVD), or atomic layer deposition (ALD), for example, and can be patterned in any suitable manner (unless specifically indicated otherwise), such as via etching and/or lithographic techniques, for example. Further, the term "exemplary" as used herein merely meant to mean an example, rather than the best. Similarly, "conglomerate" is intended to be broadly construed to comprise mixture, composition, compound, alloy, accumulation, aggregation, etc.

Although one or more aspects of the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In addition, while a particular feature or aspect of the invention may have been disclosed with respect to only one of several implementations, such feature or aspect may be combined with one or more other features or aspects of the other implementations as may be desired and/or advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method of forming metal gate transistors, comprising:
   forming a first metal over a dielectric layer overlying a substrate, the first metal having a first work function;
   forming a layer of barrier material over the first metal;
   patterning the barrier material to expose the first metal in a first region;
   forming a second metal over the exposed first metal in the first region;
   annealing so that the second metal diffuses into the first metal in the first region to create a first conglomerate in the first region having a second work function, wherein the second metal remains unreacted in a second region;
   removing the unreacted second metal;
   after removing the unreacted second metal, forming additional barrier material over the first conglomerate;
   forming a first transistor type in the first region; and
   forming a second transistor type in a second region comprising the first metal.

2. The method of claim 1, wherein at least one of the first metal comprises at least one of W, Mo and Ru, and the second metal comprises at least one of La, Y, Hf, Zr, and Ti.

3. The method of claim 1, wherein at least one of the second metal comprises at least one of W, Mo and Ru, and the first metal comprises at least one of La, Y, Hf, Zr, and Ti.

4. The method of claim 2, wherein at least one of the first work function is between about 3.5 eV and about 4.5 eV, and the second work function is between about 4.5 eV and about 5.5 eV.

5. The method of claim 3, wherein at least one of the second work function is between about 3.5 eV and about 4.5 eV, and the first work function is between about 4.5 eV and about 5.5 eV.

6. A method of forming metal gate transistors, comprising:
   forming a first metal over a dielectric layer overlying a substrate, the first metal having a first work function;
   forming a second metal over the first metal;
   patterning the second metal so that the second metal remains over the first metal in a first region; and
   annealing so that the second metal diffuses into the first metal in the first region to create a first conglomerate in the first region having a second work function;
   after the annealing step, forming a barrier material over the first conglomerate and first metal;
   forming a layer of polysilicon over the barrier material;
   forming a first transistor type in the first region; and
   forming a second transistor type in a second region comprising the first metal.

7. The method of claim 6, wherein at least one of the first metal comprises at least one of W, Mo and Ru, and the second metal comprises at least one of La, Y, Hf, Zr, and Ti.

8. The method of claim 6, wherein at least one of the second metal comprises at least one of W, Mo and Ru, and the first metal comprises at least one of La, Y, Hf, Zr, and Ti.

9. The method of claim 7, wherein at least one of the first work function is between about 3.5 eV and about 4.5 eV, and the second work function is between about 4.5 eV and about 5.5 eV.

10. The method of claim 8, wherein at least one of the second work function is between about 3.5 eV and about 4.5 eV, and the first work function is between about 4.5 eV and about 5.5 eV.

* * * * *